(12) United States Patent
Watanuki et al.

(10) Patent No.: US 10,211,352 B2
(45) Date of Patent: Feb. 19, 2019

(54) GERMANIUM PHOTODIODE

(71) Applicant: Renesas Electronics Corporation, Tokyo (JP)

(72) Inventors: Shinichi Watanuki, Ibaraki (JP); Futoshi Komatsu, Ibaraki (JP); Tomoo Nakayama, Ibaraki (JP); Takashi Ogura, Ibaraki (JP); Teruhiro Kuwajima, Ibaraki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/797,230

(22) Filed: Oct. 30, 2017

(65) Prior Publication Data

US 2018/0138325 A1 May 17, 2018

(30) Foreign Application Priority Data

Nov. 16, 2016 (JP) .................................. 2016-223188

(51) Int. Cl.
*H01L 31/028* (2006.01)
*H01L 31/02* (2006.01)
*H01L 31/0232* (2014.01)

(52) U.S. Cl.
CPC ...... *H01L 31/028* (2013.01); *H01L 31/02005* (2013.01); *H01L 31/02327* (2013.01)

(58) Field of Classification Search
CPC .................. H01L 31/105; H01L 27/14643; H01L 31/028
See application file for complete search history.

(56) References Cited

U.S. PATENT DOCUMENTS

| 8,304,272 | B2 | 11/2012 | Assefa et al. |
| 9,177,812 | B2 | 11/2015 | Martens et al. |
| 9,490,118 | B2 * | 11/2016 | Tseng ................ H01L 21/02532 |
| 9,640,702 | B2 * | 5/2017 | Knoll .................... H01L 31/105 |

FOREIGN PATENT DOCUMENTS

| JP | 2012-124483 A | 6/2012 |
| JP | 2013-207231 A | 10/2013 |
| JP | 2015-092641 A | 5/2015 |

* cited by examiner

*Primary Examiner* — Quoc Hoang
(74) *Attorney, Agent, or Firm* — Sughrue Mion, PLLC

(57) ABSTRACT

Germanium (Ge) contamination to a semiconductor manufacturing apparatus is suppressed. Germanium is a dissimilar material in a silicon semiconductor process. A semiconductor device is provided with a Ge photodiode including an n-type germanium layer, and a plug capacitively coupled to the n-type germanium layer. In other words, the n-type germanium layer of the Ge photodiode and the plug are not in direct contact with each other but are capacitively coupled to each other.

18 Claims, 9 Drawing Sheets

GERMANIUM PHOTODIODE

CROSS-REFERENCE TO RELATED APPLICATIONS

The disclosure of Japanese Patent Application No. 2016-223188 filed on Nov. 16, 2016 including the specification, drawings and abstract is incorporated herein by reference in its entirety.

The present invention relates to a semiconductor device, for example, a technique effectively used for a semiconductor device having a light receiving element including a germanium layer.

BACKGROUND

Japanese Unexamined Patent Application Publication No. 2015-92641 describes a technique relating to a photo-detection device that electrically couples a monocrystalline n-type Ge material and an electrode via a germanide region.

Japanese Unexamined Patent Application Publication No. 2013-207231 describes a technique for reducing a current leak by forming a Si protective film over a Ge layer. In this technique, silicon (Si) is fully joined as a nickel silicide layer (NiSi) to a NiGe layer in a region where the Si protective film is in contact with a metallic layer, thereby reducing a contact resistance. The nickel silicide layer (NiSi) is a mixed crystal layer containing nickel (Ni).

Japanese Unexamined Patent Application Publication No. 2012-124483 describes a technique for reducing a contact resistance by forming electrodes on an n-type Ge region with an interfacial silicon layer doped with an n-type impurity between the electrodes and the n-type Ge region.

SUMMARY

In a silicon photonics technique, a light receiving element having the function of photoelectric conversion is necessary for integrating an optical circuit and an electronic circuit. In a silicon photonics technique where a silicon layer is used as an optical waveguide layer, particularly, a photodiode (Hereinafter, will be referred to as a Ge photodiode) serves as a light receiving element in which germanium having a smaller band gap than silicon is used to absorb light (infrared light) propagating through the silicon layer.

The Ge photodiode is formed by epitaxially growing a Ge layer partially on a silicon substrate through, for example, a silicon semiconductor process. Since Ge is a dissimilar material in the silicon semiconductor process, a measure for avoiding contamination to a semiconductor manufacturing apparatus has been requested.

Other problems and new characteristics will be clarified by a description of the present specification and the accompanying drawings.

A semiconductor device according to an embodiment is provided with a light receiving element including a germanium layer and a plug capacitively coupled to the germanium layer.

The embodiment can suppress contamination to a semiconductor manufacturing apparatus, the contamination being caused by germanium (Ge) that is a dissimilar material in a silicon semiconductor process.

DETAILED DESCRIPTION

Figure 1:
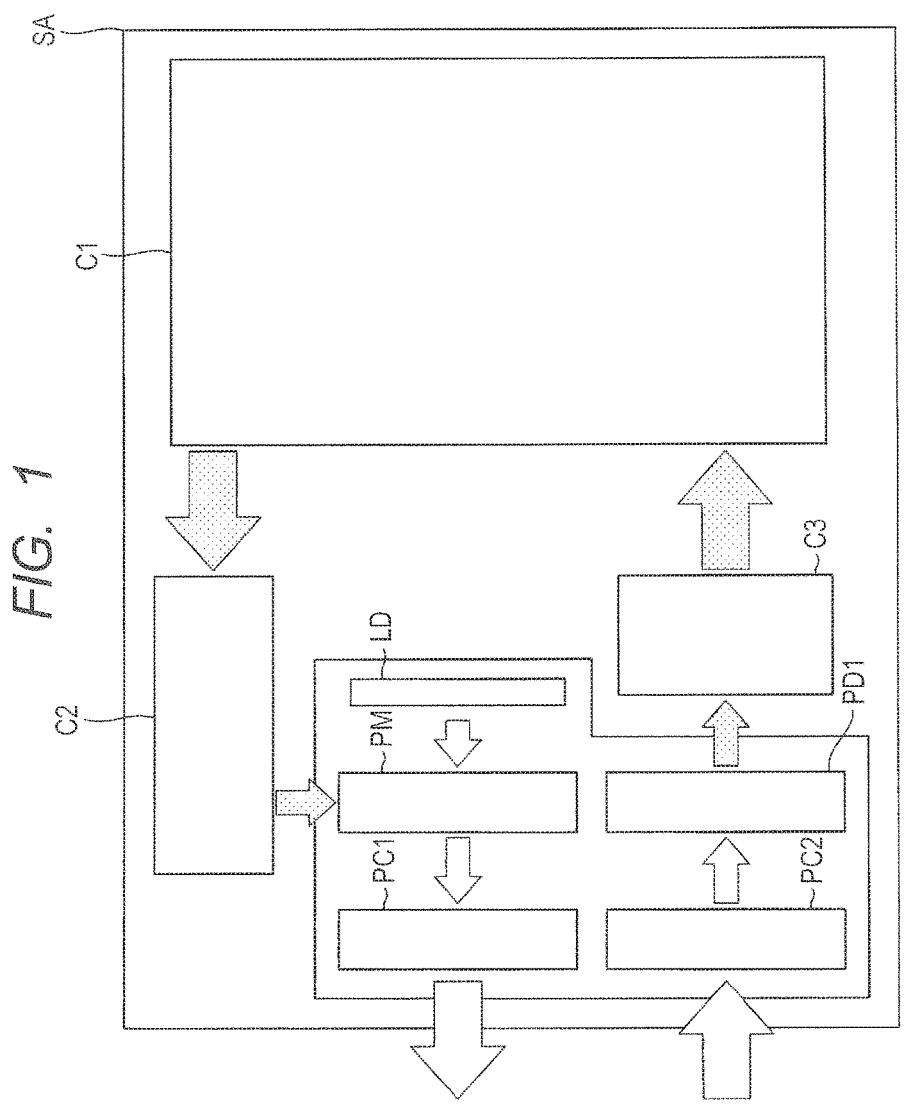
FIG. 1 is a schematic diagram showing a configuration example of a semiconductor device according to an embodiment.

In the following embodiment, for the convenience of explanation, the present invention will be described as a plurality of sections or embodiments. The sections or embodiments are relevant to one another unless otherwise specified. One of the sections or embodiments is, for example, a modification, a detail, and a supplementary explanation of some or all of the other sections or embodiments.

In the following embodiment, the number of elements (including a number, a numeric value, an amount, and a range) is not limited to a specific number unless otherwise specified or clearly limited to the specific number in theory. Thus, the number of elements may be larger or smaller than a specific number.

Obviously, the constituent elements (including element steps) of the following embodiment are not always necessary unless otherwise specified or clearly required in theory.

Similarly, in the following embodiment, the shapes and positional relationships of the constituent elements substantially include the close or similar shapes of the constituent elements unless otherwise specified or clearly excluded in theory. This holds for the numeric value and the range as well.

In all the drawings of the following embodiment, the same members are fundamentally indicated by the same reference numerals and the repeated explanation thereof is omitted. Plan views may be hatched to be clarified.

<The Configuration of a Semiconductor Device>

Referring to FIG. 1, a configuration example of a semiconductor device according to the present embodiment will be described below.

FIG. 1 is a schematic diagram showing a configuration example of a semiconductor device SA according to the present embodiment. As shown in FIG. 1, the semiconductor device SA has an electronic circuit C1 including a control circuit and a memory circuit, an electronic circuit C2 including a transceiver integrated circuit, and an electronic circuit C3 including a receiver integrated circuit.

The semiconductor device SA of the present embodiment further includes an optical circuit. Specifically, the optical circuit of the present embodiment includes, for example, a light source LD configured with a semiconductor laser, a light modulator PM, an optical coupler PC1, an optical coupler PC2, and a Ge photodiode (light receiving element) PD1.

The semiconductor device SA configured thus according to the present embodiment operates as follows: an electric signal generated in the electronic circuit C1 is first transmitted to the light modulator PM through the electronic circuit C2 including the transceiver integrated circuit. The light modulator PM is an optical device that converts an electric signal to an optical signal. At this point, for example, a continuous wave laser beam is incident on the light modulator PM from the light source LD. In the light modulator PM, the phase of the incident continuous wave laser beam is operated to change the state of the optical signal. This can match (modulate) the electric signal with an optical phase state. The light source LD includes, for example, a semiconductor laser, a lens, a prism mirror, and a photocoupler The optical signal modulated in the light modulator PM is outputted from the semiconductor device SA to the outside through the optical coupler PC1, e.g., a grating coupler or a spot-size converter, whereas an optical signal inputted to the semiconductor device SA is transmitted to the Ge photodiode PD1 through the optical coupler PC2, e.g., a grating coupler or a spot-size converter. The Ge photodiode PD1 is an optical device that converts an optical signal to an electric signal. The electric signal converted in the Ge photodiode PD1 is transmitted to the electronic circuit C1 through the electronic circuit C3.

An electric wire made of a conductive material, e.g., aluminum (Al), copper (Cu), or tungsten (W) is mainly used as a transmission line for the electric signal transmitted from the electronic circuit C1 to the light modulator PM through the electronic circuit C2 and the electric signal transmitted from the Ge photodiode PD1 to the electronic circuit C1 through the electronic circuit C3. A transmission line for the optical signal is, for example, an optical-signal transmission line (optical waveguide) including a polysilicon film.

In this configuration, each of the electronic circuit C1, the electronic circuit C2, and the electronic circuit C3 is formed on, for example, a single semiconductor chip. The light modulator PM, the optical coupler PC1, the optical coupler PC2, and the Ge photodiode PD1 are formed on, for example, a single optical semiconductor chip. Furthermore, some members constituting the light source LD, for example, a photocoupler is also formed on the optical semiconductor chip. The semiconductor chip, the optical semiconductor chip, and the light source LD are mounted on, for example, an interposer so as to constitute the semiconductor device SA.

In the present embodiment, the electronic device and the optical device are respectively formed on the semiconductor chip and the optical semiconductor chip. The present invention is not limited to this configuration. For example, the electronic device and the optical device may be formed on the single semiconductor chip.

<The Need for the Ge Photodiode>

As described above, a recent technique of silicon photonics has been actively developed in which an optical-signal transmission line made of silicon (Si) is produced on a substrate and various optical devices and electronic devices are integrated on a platform that is an optical circuit configured with the optical-signal transmission line, achieving an optical communication module.

For optical circuits basically configured with optical waveguides formed on silicon substrates, silicon waveguides are mainly used, each of which includes a silicon core layer covered with a clad layer including a silicon oxide layer with a lower index of refraction than silicon. Silicon is a material widely used for electronic circuits. Using such a silicon waveguide allows the fabrication of an optical circuit and an electronic circuit on the same substrate.

The integration of the optical circuit and the electronic circuit requires a light receiving element (photo detector) for converting an optical signal to an electric signal. A light receiving element examined to be used for the silicon photonics technique is made of germanium (Ge) having a smaller band gap (energy gap) than silicon. This is because for the photoelectric conversion of near infrared radiation up to about 1.6 μm within a communication wavelength range, a band gap needs to be smaller than that of near infrared radiation energy. Moreover, germanium has high compatibility with silicon and thus light receiving elements made of germanium can be advantageously formed into a monolithic pattern on a silicon waveguide.

Hence, in the present embodiment, it is assumed that a Ge photodiode made of germanium is used for a light receiving element. In this case, the Ge photodiode is formed by epitaxially growing a Ge layer partially on a silicon substrate through, for example, a silicon semiconductor process. Since Ge is a dissimilar material in the silicon semiconductor process, a measure for avoiding contamination to a semiconductor manufacturing apparatus has been requested.

In the following explanation, the scope for improvement additionally found by the present inventors will be first discussed according to the related art. After that, a technical idea according to a first embodiment will be discussed as a measure for improvement.

<Description of the Related Art>

In the present specification, "related art" is a technique relating to a new problem found by the present inventors. The technique is not publicly known but is described according to an assumed technique (unknown technique) of a new technical idea.

Figure 2:
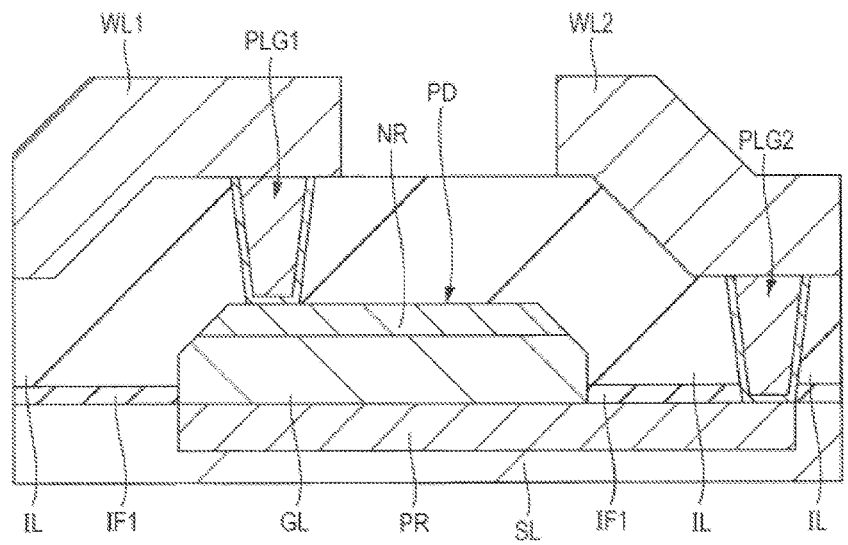
FIG. 2 is a cross-sectional view schematically showing the configuration of a semiconductor device including a Ge photodiode according to the related art.

FIG. 2 is a cross-sectional view schematically showing the configuration of a semiconductor device including a Ge photodiode PD according to the related art. In FIG. 2, the semiconductor device according to the related art includes a silicon layer SL made of, for example, silicon single crystal. The silicon layer SL acts as an optical waveguide. The surface region of the silicon layer SL is doped with a p-type impurity, e.g., boron (B), which forms a p-type semiconductor region PR in the surface region of the silicon layer SL. As shown in FIG. 2, an insulating film IF1 including, for example, a silicon oxide film is formed on the silicon layer SL having the p-type semiconductor region PR, and an opening is partially formed on the insulating film IF1. The p-type semiconductor region PR is exposed from the opening and a Ge photodiode is formed on the p-type semiconductor region PR. In other words, in the related art of FIG. 2, the Ge photodiode PD acting as a light receiving element is formed in contact with the p-type semiconductor region PR. Specifically, as shown in FIG. 2, the Ge photodiode PD has a structure formed on the p-type semiconductor region PR. At this point, the structure includes an intrinsic germanium layer GL and an n-type germanium layer NR formed on the intrinsic germanium layer GL. Thus, the Ge photodiode PD constitutes a PIN photodiode.

Subsequently, as shown in FIG. 2, an interlayer insulating film IL is formed so as to cover the Ge photodiode PD. The interlayer insulating film IL has a plug PLG1 and a plug PLG2 that penetrate the interlayer insulating film IL. For example, the plug PLG1 is coupled to the n-type germanium layer NR formed on the Ge photodiode PD, whereas the plug PLG2 is coupled to the p-type semiconductor region PR formed in the silicon layer SL. At this point, the plug PLG1 and the plug PLG2 each include a barrier conductor film formed on the inner wall of a contact hole and, for example, a conductor film filling the contact hole. The conductor film embedded in the contact hole is, for example, an aluminum film or a tungsten film. Moreover, as shown in FIG. 2, wires are formed on the interlayer insulating film IL having the plug PLG1 and the plug PLG2. The wires include, for example, a wire WL1 coupled to the plug PLG1 and a wire WL2 coupled to the plug PLG2.

<Scope for Improvement>

The scope for improvement will be discussed for the manufacturing process of the Ge photodiode PD configured thus in the related art. Specifically, in a silicon semiconductor process for manufacturing a Ge photodiode, Ge is a dissimilar material and thus the scope for improvement is apparently Ge contamination to a semiconductor manufacturing apparatus used in the silicon semiconductor process. As shown in FIG. 2, in the Ge photodiode PD of the related art, the n-type germanium layer NR constituting the Ge photodiode and the plug PLG1 are in direct contact with each other, so that the scope for improvement is apparently Ge contamination. The scope for improvement will be discussed below with reference to the accompanying drawings.

Figure 3:
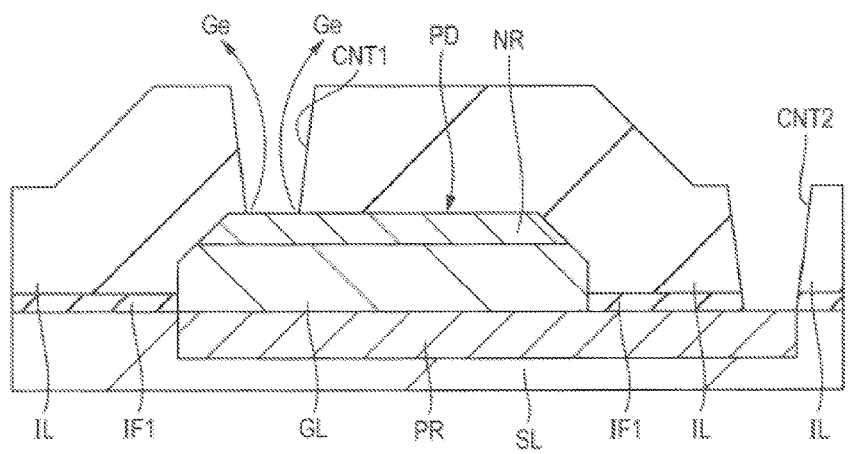
FIG. 3 is a schematic diagram for explaining the scope for improvement in the related art.

FIG. 3 is a schematic diagram for explaining the scope for improvement in the related art. As shown in FIG. 3, in the manufacturing process of the Ge photodiode PD in the related art, the interlayer insulating film IL is formed so as to cover the Ge photodiode PD and then a contact hole CNT1 and a contact hole CNT2 are formed on the interlayer insulating film IL according to, for example, photolithography and etching. At this point, the contact hole CNT1 is formed so as to reach the n-type germanium layer NR constituting the Ge photodiode PD. Thus, in the step of forming the contact hole CNT1 on the interlayer insulating film IL, the formation of the contact hole CNT1 reaching the n-type germanium layer NR may reduce Ge, a material of the n-type germanium layer NR. Hence, in the step of forming the contact hole CNT1, Ge is dispersed into the semiconductor manufacturing apparatus as shown in FIG. 3, resulting in Ge contamination to the semiconductor manufacturing apparatus. In other words, in the related art, the contact hole CNT1 is formed so as to reach the n-type germanium layer NR of the Ge photodiode PD, revealing Ge contamination to the semiconductor manufacturing apparatus.

A silicon waveguide formed in silicon photonics, in particular, is quite sensitive to accuracy of finishing in a silicon semiconductor process. Specifically, the higher the degree of roughness (surface roughness) on the silicon waveguide, the wider the scatter of light through the silicon waveguide, which may degrade the performance of the silicon waveguide. Hence, the silicon semiconductor process used for the silicon waveguide allows accurate machining with a relatively high degree of integration. For this reason, the silicon semiconductor process allowing accurate machining with a high degree of integration is also used for forming the Ge photodiode along with the silicon waveguide.

However, in many cases, Ge is not used for integrated circuits manufactured by the most advanced silicon semiconductor process allowing accurate machining. Thus, Ge is a dissimilar material in the most advanced silicon semiconductor process allowing accurate machining. This requires careful prevention of transfer of Ge, which is a dissimilar material, to a semiconductor manufacturing apparatus other than a target apparatus in the most advanced silicon semiconductor process allowing accurate machining. For example, in the step of exposing Ge, Ge is likely to contaminate other semiconductor manufacturing apparatuses and thus due care needs to be exercised. Thus, in the silicon semiconductor process where Ge is exposed, the frequency of cleaning and replacement of the semiconductor manufacturing apparatus increases, leading to a heavier workload of maintenance and the need for specializing the semiconductor manufacturing apparatus.

As shown in FIG. 3, particularly in the step of forming the contact hole CNT1, exposed Ge that makes up the n-type germanium layer NR is also exposed to the atmosphere of etching. This requires measures against contamination to the semiconductor manufacturing apparatus (including a dry etching device, a resist removing device, and a sputtering device) used in the subsequent steps. In other words, in the related art, the step of forming the contact hole CNT1 reaching the n-type germanium layer NR of the Ge photodiode PD increases the influence of Ge contamination to the semiconductor manufacturing apparatus. Thus, in addition to Ge exposure, the present embodiment in particular features the step of forming the contact hole where Ge making up the n-type germanium layer NR is also exposed to the atmosphere of etching, and measures are provided to suppress Ge contamination to the semiconductor manufacturing apparatus in the step of forming the contact hole. A technical idea for the measures will be discussed according to the present embodiment.

<Basic Idea of the Embodiment>

According to the basic idea of the present embodiment, in the step of forming the contact hole on the interlayer insulating film, the contact hole is not formed so as to reach the n-type germanium layer constituting the Ge photodiode but the formation of the contact hole is stopped before reaching the n-type germanium layer. According to the basic idea, the n-type germanium layer is not exposed from the bottom of the contact hole in the step of forming the contact hole. This does not expose Ge and thus can prevent exposure of Ge to the atmosphere of etching. Hence, the basic idea of the present embodiment can effectively prevent Ge contamination to the semiconductor manufacturing apparatus in the step of forming the contact hole. The configuration of the Ge photodiode implemented according to the basic idea of the present embodiment will be described below.

<The Configuration of the Ge Photodiode>

Figure 4:
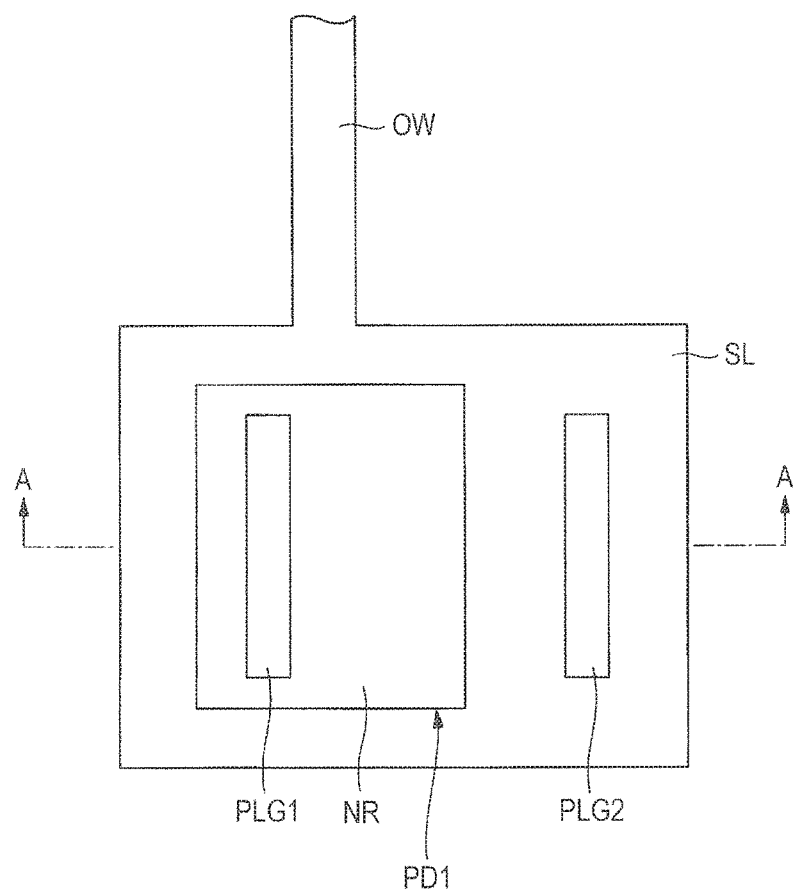
FIG. 4 is a plan view schematically showing the configuration of a Ge photodiode according to the embodiment.

FIG. 4 is a plan view schematically showing the configuration of a Ge photodiode PD1 according to the present embodiment. In FIG. 4, the Ge photodiode PD1 of the present embodiment is formed on a rectangular silicon layer SL in plan view. At this point, the silicon layer SL is coupled to an optical waveguide OW. The Ge photodiode PD1 of the present embodiment includes an n-type germanium layer NR. A plug PLG1 is arranged on the n-type germanium layer NR. The n-type germanium layer NR is included in the silicon layer SL in plan view. A plug PLG2 is arranged on the silicon layer SL so as to be coupled to the silicon layer SL.

Figure 5:
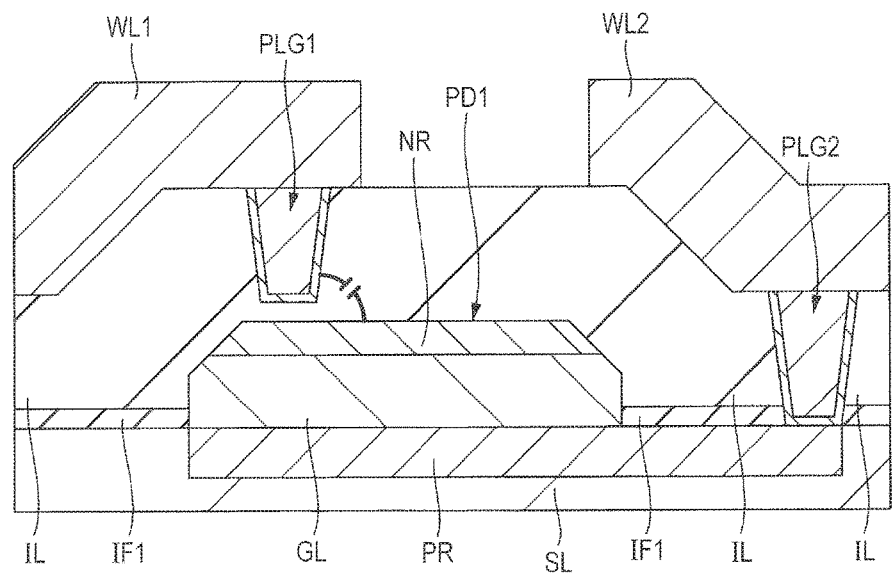
FIG. 5 is a cross-sectional view taken along line A-A of FIG. 4.

FIG. 5 is a cross-sectional view taken along line A-A of FIG. 4. As shown in FIG. 5, for example, a p-type semiconductor region PR is formed in the silicon layer SL made of silicon single crystal. The Ge photodiode PD1 is formed on the p-type semiconductor region PR. At this point, as shown in FIG. 4, the silicon layer SL is coupled to the optical waveguide OW and acts as an optical waveguide layer. The Ge photodiode PD1 is configured to receive light propagating through the silicon layer SL acting as the optical waveguide layer. In other words, the Ge photodiode PD1 of the present embodiment is configured to receive light propagating from the optical waveguide OW to the silicon layer SL in FIG. 4. In other words, the Ge photodiode PD1 of the present embodiment is in contact with the silicon layer SL so as to receive light propagating through the silicon layer SL acting as the optical waveguide layer.

Subsequently, as shown in FIG. 5, an insulating film IF1 including, for example, a silicon oxide film is formed so as to cover the silicon layer SL having the p-type semiconductor region PR. The insulating film IF1 has an opening from which the surface of the p-type semiconductor region PR is partially exposed. On the surface of the p-type semiconductor region PR exposed from the opening, an intrinsic germanium layer GL is formed inside the opening. Moreover, the n-type germanium layer NR is formed on the intrinsic germanium layer GL.

As described above, the structure of the Ge photodiode PD1 according to the present embodiment is formed on the silicon layer SL. As shown in FIG. 5, the structure of the Ge photodiode PD1 according to the present embodiment is formed on the opening penetrating the insulating film IF1. Furthermore, the structure of the Ge photodiode PD1 according to the present embodiment is formed on the p-type semiconductor region PR formed on the surface of the silicon layer SL. At this point, the silicon layer SL and the p-type semiconductor region PR are made of silicon (Si), whereas the intrinsic germanium layer GL and the n-type germanium layer NR that constitute the structure of the Ge photodiode PD1 are made of germanium (Ge).

After that, as shown in FIG. 5, an interlayer insulating film IL including, for example, a silicon oxide film is formed so as to cover the Ge photodiode PD1 formed on the p-type semiconductor region PR. Moreover, the plug PLG1 is formed on the interlayer insulating film IL such that the bottom of the plug PLG1 stops in the interlayer insulating film IL without reaching the n-type germanium layer NR of the Ge photodiode PD1. The plug PLG1 is electrically coupled to a wire WL1 formed on the interlayer insulating film IL. The interlayer insulating film IL and the insulating film IF1 also have the plug PLG2 that penetrates the interlayer insulating film IL and the insulating film IF1 and reaches the p-type semiconductor region PR. The plug PLG2 is electrically coupled to a wire WL2 formed on the top surface of the interlayer insulating film IL.

The plug PLG1 and the plug PLG2 each include, for example, a barrier conductor film made up of a titanium/titanium nitride film and an aluminum film (aluminum alloy film) or a tungsten film, whereas the wire WL1 and the wire WL2 each include, for example, a barrier conductor film made up of a titanium/titanium nitride film and an aluminum film (aluminum alloy film).

In the Ge photodiode PD1 configured thus according to the present embodiment, the intrinsic germanium layer GL interposed between the p-type semiconductor region PR and the n-type germanium layer NR is depleted to act as a depletion layer. Thus, when light having larger energy than the band gap of germanium is incident on the intrinsic germanium layer GL acting as a depletion layer, electrons in a valence band are excited to a conduction band, thereby generating hole-electron pairs. The electrons excited to the conduction band are then injected into the n-type germanium layer NR by an electric field in the depletion layer, whereas positive holes formed in the valence band are injected into the p-type semiconductor region PR by the electric field in the depletion layer. Thus, the electrons injected into the n-type germanium layer NR flow along the passage of the n-type germanium layer NR, (capacitive coupling), the plug PLG1, and the wire WL1, whereas the positive holes injected into the p-type semiconductor region PR flow along the passage of the p-type semiconductor region PR, the plug PLG2, and the wire WL2. It is thus understood that the Ge photodiode PD1 of the present embodiment implements the function of photoelectric conversion that converts incident light into an electric signal (current). In the present embodiment, in particular, it is assumed that light (optical signal) transmitted along the passage of the optical waveguide OW, the silicon layer SL, the p-type semiconductor region PR, and the intrinsic germanium layer GL in FIG. 4 is, for example, an optical signal at a high frequency of several tens GHz. Thus, as shown in FIG. 5, even if the n-type germanium layer NR of the Ge photodiode PD1 and the plug PLG1 are not in direct contact with each other, a capacitive element between the n-type germanium layer NR and the plug PLG1 in the Ge photodiode PD1 functions for a high-frequency electric signal generated by photoelectric conversion on a high-frequency optical signal, the interlayer insulating film IL being interposed between the n-type germanium layer NR and the plug PLG1. In other words, as a result of capacitive coupling between the n-type germanium layer NR and the plug PLG1, the high-frequency electric signal can be electrically transmitted between the n-type germanium layer NR and the plug PLG1. This proves that the plug PLG1 acts as a transmission line for electric signals generated by photoelectric conversion on optical signals inputted to the intrinsic germanium layer GL and the n-type germanium layer NR.

As described above, the semiconductor device of the present embodiment is provided with the Ge photodiode PD1 including the intrinsic germanium layer GL and the n-type germanium layer NR, the plug PLG1 separated from the n-type germanium layer NR, and the interlayer insulating film IL interposed between the n-type germanium layer NR and the plug PLG1. In other words, in the semiconductor device of the present embodiment, the n-type germanium layer NR and the plug PLG1 are not in contact with each other.

<A Method of Manufacturing the Ge Photodiode>

The semiconductor device including the Ge photodiode PD1 is configured thus according to the present embodiment. The manufacturing method will be discussed below with reference to the accompanying drawings.

Figure 6:
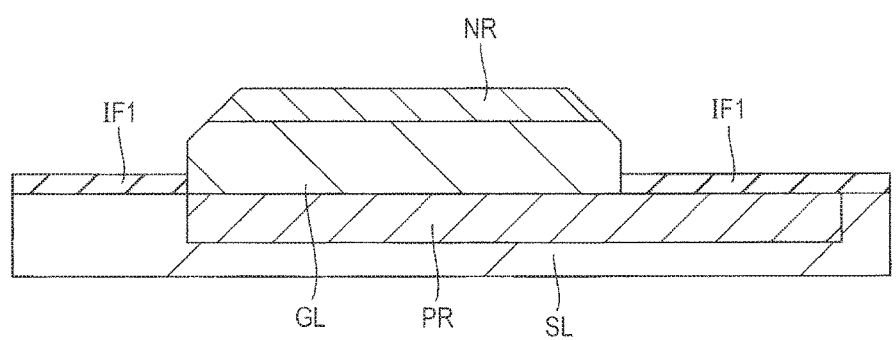
FIG. 6 is a cross-sectional view showing the manufacturing process of the semiconductor device according to the embodiment.

First, as shown in FIG. 6, a SOI substrate is prepared that includes a support substrate (not shown), an embedded insulating layer (not shown) formed on the support substrate, and the silicon layer SL formed on the embedded insulating layer. The silicon layer SL of the SOI substrate is then patterned by photolithography and etching. Specifically, the silicon layer SL is patterned so as to form an optical waveguide layer. After that, the silicon layer SL is implanted with a p-type impurity, e.g., boron (B) by photolithography and ion implantation, forming the p-type semiconductor region PR on the surface of the silicon layer SL.

After that, as shown in FIG. 6, the insulating film IF1 is formed so as to cover the patterned silicon layer SL. The insulating film IF1 includes, for example, a silicon oxide film and can be formed by, for example, chemical vapor deposition (CVD). Thus, the patterned silicon layer SL is surrounded by the embedded insulating layer and the insulating film IF1. Since the silicon oxide film has a lower index of refraction than the silicon layer SL, an optical waveguide layer is formed, in which the silicon layer SL having a high index of refraction serves as a core layer and the silicon oxide film having a low index of refraction serves as a clad layer. In other words, light propagating through the silicon layer SL is totally reflected by the clad layer having a low index of refraction and thus the light propagates through the silicon layer SL, which serves as the core layer, without leaking into the clad layer.

Subsequently, as shown in FIG. 6, an opening penetrating the insulating film IF1 is formed on the insulating film IF1 by photolithography and etching. This partially exposes the surface of the p-type semiconductor region PR from the bottom of the opening. After that, as shown in FIG. 6, the intrinsic germanium layer GL is formed by selective epitaxial growth on the surface of the p-type semiconductor region PR exposed from the bottom of the opening. Specifically, the intrinsic germanium layer GL can be mainly formed by selective epitaxial growth with monogermane gas. Subsequently, the n-type germanium layer NR is formed by selective epitaxial growth, in which phosphine gas is added to monogermane gas in the same chamber, so as to cover the surface of the intrinsic germanium layer GL. Hence, as shown in FIG. 6, the n-type germanium layer NR is formed so as to cover the surface of the intrinsic germanium layer GL. In this way, the structure of the Ge photodiode PD1 including the intrinsic germanium layer GL and the n-type germanium layer NR can be formed by continuous selective epitaxial growth where source gas to be supplied is changed in the same chamber.

The present embodiment described an example of the formation of the intrinsic germanium layer GL and the n-type germanium layer NR by continuous epitaxial growth where source gas is changed. The present invention is not limited to the technical idea of the present embodiment. For example, after the intrinsic germanium layer GL is formed by selective epitaxial growth, the surface of the intrinsic germanium layer GL may be doped with an n-type impurity, e.g., phosphorus (P) by photolithography and ion implantation so as to form the n-type germanium layer NR.

Figure 7:
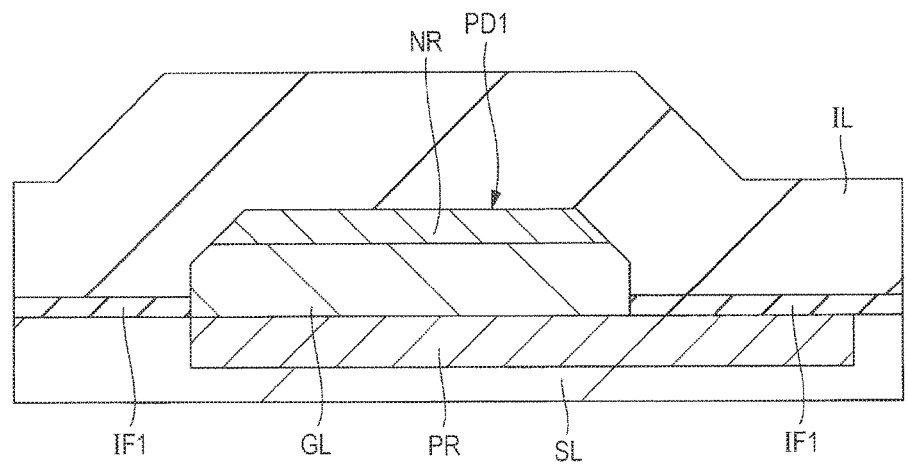
FIG. 7 is a cross-sectional view showing the manufacturing process of the semiconductor device after FIG. 6.

Subsequently, as shown in FIG. 7, the interlayer insulating film IL is formed on the SOI substrate as well as on the structure of the Ge photodiode PD1. For example, the interlayer insulating film IL can be formed using a silicon oxide film by CVD.

Figure 8:
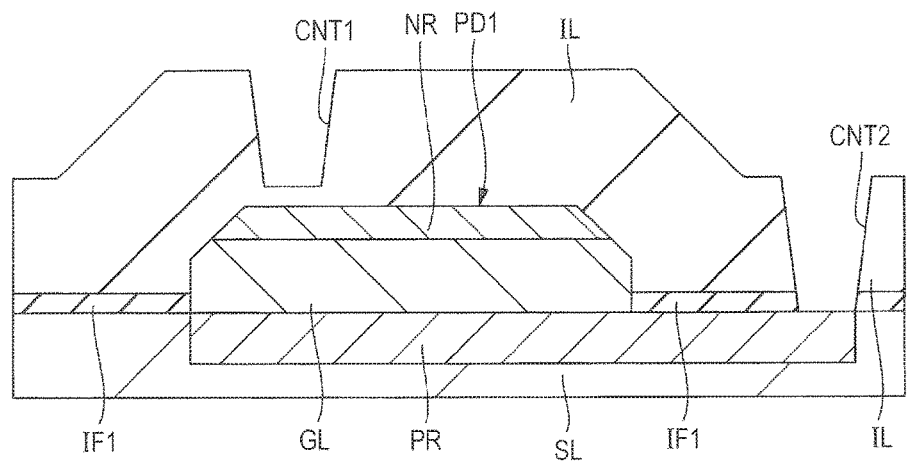
FIG. 8 is a cross-sectional view showing the manufacturing process of the semiconductor device after FIG. 7.

After that, as shown in FIG. 8, the contact hole CNT1 is formed on the interlayer insulating film IL by photolithography and etching such that the bottom of the contact hole CNT1 is arranged in the interlayer insulating film IL without reaching the n-type germanium layer NR. Moreover, the contact hole CNT2 is formed so as to penetrate the interlayer insulating film IL and the insulating film IF1 and reach the surface of the p-type semiconductor region PR. At this point, for example, the contact hole CNT1 and the contact hole CNT2 of the present embodiment are formed in different steps. This is because the etching amount of the interlayer insulating film IL varies between the contact hole CNT1 in which the bottom does not reach the surface of the n-type germanium layer NR and the contact hole CNT2 in which the bottom reaches the p-type semiconductor region PR.

Subsequently, as shown in FIG. 5, the barrier conductor film is formed on the surface of the interlayer insulating film IL including the contact hole CNT1 and the contact hole CNT2, and then an aluminum film (aluminum alloy film) is formed on the barrier conductor film. Furthermore, the barrier conductor film is formed on the aluminum film. This can form the plug PLG1 and the plug PLG2 with the filled contact holes CNT1 and CNT2 and form a laminated film (the barrier conductor film+the aluminum film+the barrier conductor film) covering the surface of the interlayer insulating film IL. At this point, for example, the barrier conductor film includes a titanium film (Ti film) and a titanium nitride film (TiN film) and can be formed by sputtering. The aluminum film can be also formed by sputtering. Moreover, the aluminum film may be replaced with an aluminum alloy film (e.g., an Al—Si—Cu film).

After that, the laminated film formed on the surface of the interlayer insulating film IL is patterned by photolithography and etching, forming the wire WL1 electrically coupled to the plug PLG1 and the wire WL2 electrically coupled to the plug PLG2. In this way, the semiconductor device including the Ge photodiode PD1 can be manufactured according to the present embodiment.

In the present embodiment, the plug PLG1 and the plug PLG2 are formed by using, but not exclusively, the barrier conductor film and the aluminum film. For example, the plug PLG1 and the plug PLG2 can be formed by using a barrier conductor film and a tungsten film. The wire WL1 and the wire WL2 are not limited to aluminum wires and may be, for example, copper wires formed by a damascene method.

<Characteristic of the Embodiment>

A characteristic of the present embodiment will be described below. For example, as shown in FIG. 5, the present embodiment is characterized in that the n-type germanium layer NR of the Ge photodiode PD1 and the plug PLG1 are not in direct contact with each other and the n-type germanium layer NR is capacitively coupled to the plug PLG1. In other words, for example, the present embodiment is characterized in that in the step of forming the contact hole CNT1 on the interlayer insulating film IL as shown in FIG. 8, the formation of the contact hole CNT1 does not reach the n-type germanium layer NR of the Ge photodiode PD1 but is stopped before reaching the n-type germanium layer NR. According to the characteristic of the present embodiment, the n-type germanium layer NR is not exposed from the bottom of the contact hole CNT1 in the step of forming the contact hole. This does not expose Ge and thus can prevent exposure of Ge to the atmosphere of etching. Hence, according to the characteristic of the present embodiment, Ge contamination to the semiconductor manufacturing apparatus in the step of forming the contact hole can be effectively prevented.

For example, in the related art of FIG. 2, the n-type germanium layer NR of the Ge photodiode PD and the plug PLG1 are in direct contact with each other. In this case, as shown in FIG. 3, in the step of forming the contact hole CNT1 on the interlayer insulating film IL, the contact hole CNT1 is formed so as to reach the n-type germanium layer NR of the Ge photodiode PD. Thus, as shown in FIG. 3, in the step of forming the contact hole, the n-type germanium layer NR is exposed from the bottom of the contact hole CNT1 and Ge is exposed to the atmosphere of etching.

Hence, in the related art, Ge is scattered into the semiconductor manufacturing apparatus in the step of forming the contact hole CNT1 as shown in FIG. 3, causing Ge contamination to the semiconductor manufacturing apparatus. In other words, in the related art, the formation of the contact hole CNT1 reaching the n-type germanium layer NR of the Ge photodiode PD apparently causes Ge contamination to the semiconductor manufacturing apparatus used after the step of forming the contact hole.

In contrast to the related art, as shown in FIG. 8, the formation of the contact hole CNT1 is stopped in the present embodiment before reaching the n-type germanium layer NR. This means that the n-type germanium layer NR is not exposed from the bottom of the contact hole CNT1 in the step of forming the contact hole in the present embodiment. Thus, the present embodiment does not expose the n-type germanium layer NR and thus can suppress exposure of the n-type germanium layer NR to the atmosphere of etching. This can effectively prevent Ge contamination to the semiconductor manufacturing apparatus in the step of forming the contact hole.

As described above, according to the characteristic of the present embodiment, the formation of the contact hole CNT1 is stopped before reaching the n-type germanium layer NR, thereby suppressing Ge contamination to the semiconductor manufacturing apparatus in the step of forming the contact hole. Thus, as shown in FIG. 5, the n-type germanium layer NR and the plug PLG1 are separated from each other. In this case, the n-type germanium layer NR and the plug PLG1 may not be electrically coupled to each other. Regarding this point, obviously in the case of a direct-current signal (DC signal), the n-type germanium layer NR and the plug PLG1 not in direct contact with each other may not be electrically coupled to each other. In the semiconductor device of the present embodiment, however, an optical signal at several tens GHz is photoelectrically converted into a high-frequency alternating-current signal (AC signal) in the Ge photodiode PD1. Even if the n-type germanium layer NR and the plug PLG1 are separated from each other, the high-frequency alternating-current signal can be transmitted between the n-type germanium layer NR and the plug PLG1. This is because the configuration including the n-type germanium layer NR and the plug PLG1 separated from each other means the presence of the interlayer insulating film IL between the n-type germanium layer NR and the plug PLG1 as shown in FIG. 5 and the configuration allows the n-type germanium layer NR and the plug PLG1 to serve as electrodes and forms a capacitance where the interlayer insulating film IL serves as a capacitive insulating film. In other words, the impedance of the capacitance is infinite in response to the direct-current signal and is proportionate to the reciprocal of the product of a signal frequency (angular frequency) and a capacitance value. Thus, the impedance of the capacitance decreases in response to the high-frequency alternating-current signal. In extreme cases, the impedance of the capacitance decreases with the frequency of the alternating-current signal, and when the alternating-current signal has an infinite frequency, the impedance of the capacitance substantially becomes 0, causing a short circuit. In other words, the high-frequency alternating-current signal is used in the semiconductor device of the present embodiment and thus even if the insulating film (interlayer insulating film IL) is interposed between the n-type germanium layer NR and the plug PLG1, the n-type germanium layer NR and the plug PLG1 can be electrically coupled to each other by capacitive coupling. As described above, according to the characteristic of the present embodiment, the formation of the contact hole CNT1 is stopped before reaching the n-type germanium layer NR, thereby effectively preventing Ge contamination to the semiconductor manufacturing apparatus in the step of forming the contact hole. According to the characteristic of the present embodiment, the n-type germanium layer NR and the plug PLG1 can be electrically coupled to each other in response to the high-frequency alternating-current signal by indirect capacitive coupling between the n-type germanium layer NR and the plug PLG1.

Specifically, for example, if a distance between the top surface of the n-type germanium layer NR and the bottom of the plug PLG1 is 50 nm and the plug PLG1 has a bottom area of 2×10 ($\mu m^2$), the capacitance has an impedance of 1Ω or less in response to the alternating-current signal of 10 GHz or higher. The capacitance value has substantially the same impedance as in the case where the n-type germanium layer NR and the plug PLG1 are in direct contact with each other. Furthermore, indirect capacitive coupling between the n-type germanium layer NR and the plug PLG1 can electrically couple the n-type germanium layer NR and the plug PLG1 in response to the high-frequency alternating-current signal.

For a capacitance formed between the n-type germanium layer NR and the plug PLG1, the capacitive insulating film interposed between the n-type germanium layer NR and the plug PLG1 desirably has a minimum thickness. In other words, in the step of forming the contact hole, the bottom of the contact hole CNT1 is desirably stopped closest to the n-type germanium layer NR. This is because the impedance of the capacitance is inversely proportional to the capacitance value, that is, the capacitance value of the capacitance increases with decrease in the thickness of the capacitive insulating film and thus the impedance of the capacitance decreases in response to the high-frequency alternating-current signal so as to facilitate the transmission of the high-frequency alternating-current signal between the n-type germanium layer NR and the plug PLG1 that are capacitively coupled to each other. Moreover, upsizing of the bottom of the plug PLG1 is also effective in view of a reduction in the impedance of the capacitance. This is because the capacitance value of the capacitance is not only inversely proportional to the thickness of the capacitive insulating film but is also proportional to the area of a counter electrode. In other words, upsizing of the bottom of the plug PLG1 increases the capacitance value of the capacitance so as to reduce the impedance of the capacitance in response to the high-frequency alternating-current signal. This facilitates the transmission of the high-frequency AC signal between the n-type germanium layer NR and the plug PLG1 that are capacitively coupled to each other.

<First Modification>

Figure 9:
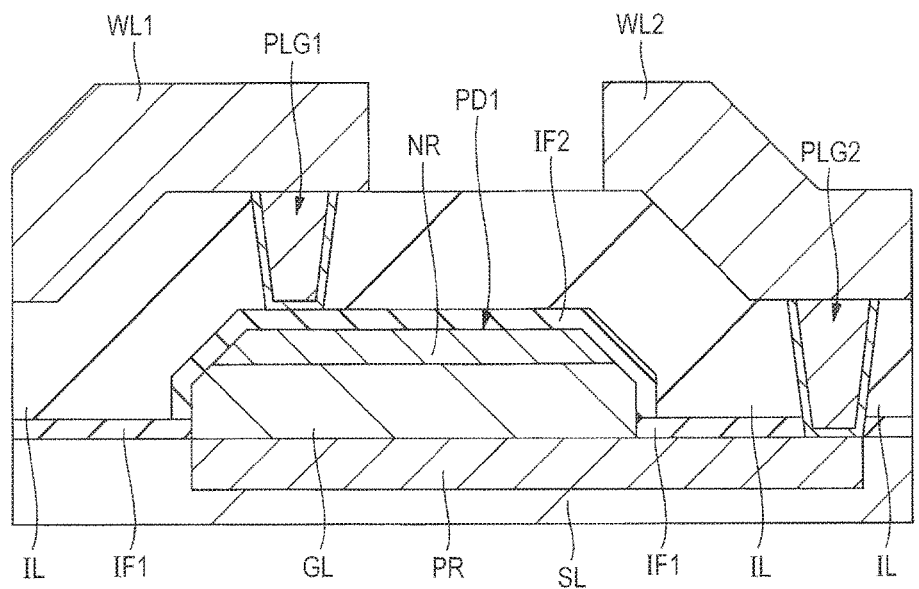
FIG. 9 is a cross-sectional view schematically showing the configuration of a semiconductor device including a Ge photodiode according to a first modification.

A first modification will be described below. FIG. 9 is a cross-sectional view schematically showing the configuration of a semiconductor device including a Ge photodiode PD1 according to the first modification. In FIG. 9, the first modification is characterized in that an insulating film IF2 is formed so as to cover an intrinsic germanium layer GL and an n-type germanium layer NR that are the constituent elements of the Ge photodiode PD1. The insulating film IF2, in particular, includes a film different from a silicon oxide film constituting an interlayer insulating film IL. Specifically, the insulating film IF2 includes, for example, a silicon nitride film or a silicon oxynitride film with an etching selection ratio to a silicon oxide film.

In this case, as shown in FIG. 9, the insulating film IF2 is formed between the n-type germanium layer NR and a plug PLG1, allowing the insulating film IF2 to act as a capacitive insulating film with a capacitance formed by the n-type germanium layer NR and the plug PLG1.

Figure 10:
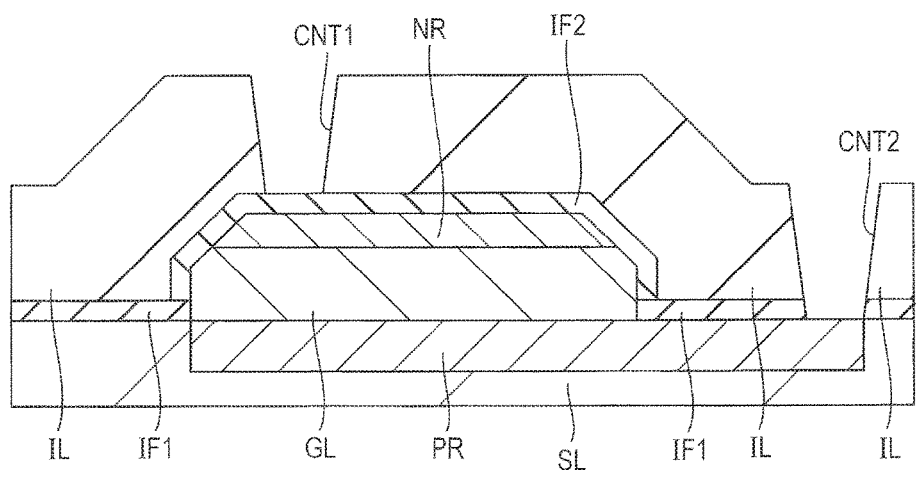
FIG. 10 is a cross-sectional view showing the manufacturing process of the semiconductor device according to the first modification.

The semiconductor device configured thus according to the first modification can achieve the following advantages. As shown in FIG. 10, the first advantage is that the insulating film IF2 can act as an etching stopper when a contact hole CNT1 is formed on the interlayer insulating film IL by etching. Specifically, the insulating film IF2 includes a film with an etching selection ratio to the silicon oxide film constituting the interlayer insulating film IL, and thus the bottom of the contact hole CNT1 automatically stops at the surface of the insulating film IF2 when the silicon oxide film is etched to form the contact hole CNT1. In other words, in the first modification, the formation of the contact hole CNT1 can be automatically stopped without controlling an etching time before reaching the n-type germanium layer NR. Thus, according to the first modification, the n-type germanium layer NR of the Ge photodiode PD1 and the plug PLG1 are not in direct contact with each other, thereby advantageously obtaining a capacitive coupling structure of the n-type germanium layer NR and the plug PLG1 with ease and reliability.

In the first modification, in particular, the insulating film IF2 acting as an etching stopper is formed only on a germanium layer and thus as shown in FIG. 10, the contact hole CNT1 and a contact hole CNT2 can be formed at different depths in the same process. This is because in the formation of the deep contact hole CNT2, etching does not proceed in the shallow contact hole CNT1 after the insulating film IF2 acting as an etching stopper is automatically exposed from the bottom of the contact hole CNT1. In other words, the insulating film IF2 acting as an etching stopper is provided under the shallow contact hole CNT1, whereas the insulating film IF2 is not provided under the deep contact hole CNT2. This can form the contact hole CNT1 and the contact hole CNT2 at different depths in the same etching process. Thus, the first modification can simplify the step of forming the contact hole CNT1 and the contact hole CNT2.

As described above, in the first modification, the insulating film IF2 is provided so as to cover the intrinsic germanium layer GL and the n-type germanium layer NR. Thus, the capacitive coupling structure of the n-type germanium layer NR and the plug PLG1 can be quite effectively obtained with ease and reliability in the simplified step of forming the contact holes.

The second advantage is that the insulating film IF2 includes a silicon nitride film or a silicon oxynitride film and thus the insulating film IF2 acting as a capacitive insulating film can have a higher dielectric constant than a silicon oxide film. Hence, the capacitance value of a capacitance increases with the dielectric constant of the insulating film IF2 acting as a capacitive insulating film, so that the impedance of the capacitance decreases in response to a high-frequency alternating-current signal. This can advantageously facilitate the transmission of the high-frequency alternating-current signal between the n-type germanium layer NR and the plug PLG1 that are capacitively coupled to each other.

<Second Modification>

The second modification will be described below. In the example of the first modification, the insulating film IF2 acting as an etching stopper includes a silicon nitride film or a silicon oxynitride film. In the second modification, the insulating film IF2 is replaced with an intrinsic silicon film acting as an etching stopper. Specifically, the second modification is characterized by the intrinsic silicon film interposed between an n-type germanium layer NR and a plug PLG1. In other words, the second modification is characterized in that the intrinsic silicon film is formed so as to cover an intrinsic germanium layer GL and the n-type germanium layer NR that are the constituent elements of a Ge photodiode PD1. The intrinsic silicon film is, in particular, different from a silicon oxide film constituting an interlayer insulating film IL and thus an etching selection ratio to the silicon oxide film can be obtained.

In this case, the intrinsic silicon film is formed between the n-type germanium layer NR and the plug PLG1, allowing the intrinsic silicon film to act as a capacitive insulating film with a capacitance formed by the n-type germanium layer NR and the plug PLG1. In this configuration, the intrinsic silicon film is a semiconductor film undoped with a conductive impurity and thus has just a few carriers with a high resistance. Thus, the intrinsic silicon film is regarded as a capacitive insulating film in the second modification. This proves that the intrinsic silicon film interposed between the n-type germanium layer NR and the plug PLG1 in the second modification leads to capacitive coupling between the n-type germanium layer NR and the plug PLG1.

Also in the configuration of the second modification, the intrinsic silicon film acts as an etching stopper as in the first modification. Thus, also in the second modification, the intrinsic silicon film covering the intrinsic germanium layer GL and the n-type germanium layer NR can quite effectively obtain a capacitive coupling structure of the n-type germanium layer NR and the plug PLG1 with ease and reliability in the simplified step of forming contact holes.

Furthermore, the intrinsic silicon film has a higher dielectric constant than the silicon oxide film and thus can obtain the same effect as in the first modification. Specifically, the capacitance value of the capacitance increases with the dielectric constant of the intrinsic silicon film acting as a capacitive insulating film, so that the impedance of the capacitance decreases in response to a high-frequency alternating-current signal. This can advantageously facilitate the transmission of the high-frequency alternating-current signal between the n-type germanium layer NR and the plug PLG1 that are capacitively coupled to each other.

Moreover, the second embodiment can obtain an advantage specific to the intrinsic silicon film. The advantage will be discussed below. In the second modification, the intrinsic germanium layer GL is first formed by selective epitaxial growth with monogermane gas, and then the n-type germanium layer NR is formed so as to cover the surface of the intrinsic germanium layer GL by selective epitaxial growth in which phosphine gas is added to monogermane gas in the same chamber. After that, in the same chamber, the intrinsic silicon film is formed on the n-type germanium layer NR by selective epitaxial growth. In this process, the intrinsic germanium layer GL and the n-type germanium layer NR are covered with the intrinsic silicon film. Since the intrinsic germanium layer GL and the n-type germanium layer NR are not exposed, Ge contamination to a semiconductor manufacturing apparatus can be effectively prevented in the step of transportation following the formation of the intrinsic germanium layer GL and the n-type germanium layer NR and in the subsequent step of forming the interlayer insulating film IL. In other words, according to the second modification, the exposure of Ge can be prevented in the step of transportation following the formation of the intrinsic germanium layer GL and the n-type germanium layer NR and in the subsequent step of forming the interlayer insulating film IL as well as the step of forming the contact holes.

This can quite effectively suppress Ge contamination to the semiconductor manufacturing apparatus over the multiple steps.

<Third Modification>

Figure 11:
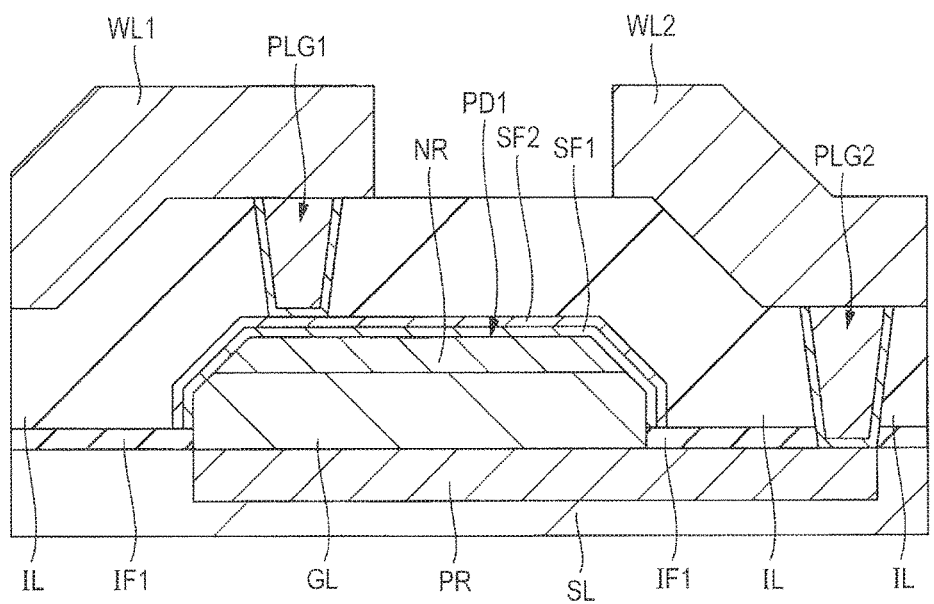
FIG. 11 is a cross-sectional view schematically showing the configuration of a semiconductor device including a Ge photodiode according to a third modification.

A third modification will be described below. FIG. 11 is a cross-sectional view schematically showing the configuration of a semiconductor device including a Ge photodiode PD1 according to the third modification. In FIG. 11, the third modification is characterized in that a silicon film SF1 is formed so as to cover an intrinsic germanium layer GL and an n-type germanium layer NR and an intrinsic silicon film SF2 is formed on the silicon film SF1. In other words, as shown in FIG. 11, the third modification is characterized in that the silicon film SF1 and the intrinsic silicon film SF2 are interposed between the n-type germanium layer NR and the plug PLG1 such that the silicon film SF1 is in contact with the n-type germanium layer NR and is doped with an n-type impurity and the intrinsic silicon film SF2 is in contact with the silicon film SF1. Also in the configuration of the third modification, the same effect can be obtained as in the second modification.

Figure 12:
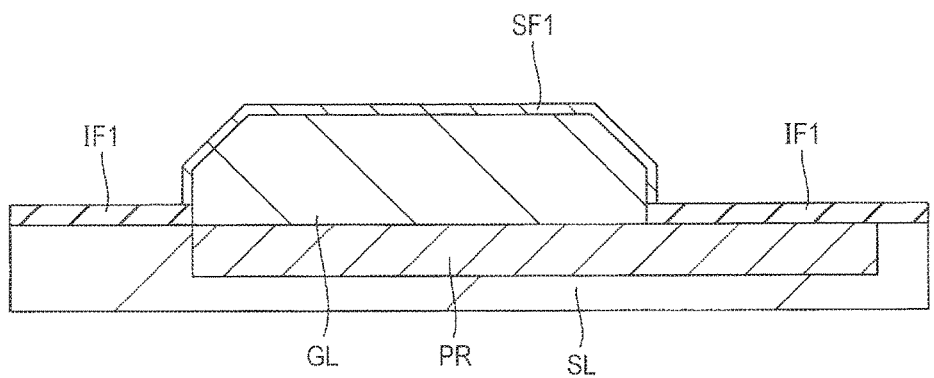
FIG. 12 is a cross-sectional view showing the manufacturing process of the semiconductor device according to the third modification.

The manufacturing process of the semiconductor device according to the third modification will be described below. First, as shown in FIG. 12, a SOI substrate is prepared that includes a support substrate (not shown), an embedded insulating layer (not shown) formed on the support substrate, and the silicon layer SL formed on the embedded insulating layer. The silicon layer SL of the SOI substrate is then patterned by photolithography and etching. Specifically, the silicon layer SL is patterned so as to form an optical waveguide layer. After that, the silicon layer SL is implanted with a p-type impurity, e.g., boron (B) by photolithography and ion implantation, forming a p-type semiconductor region PR on the surface of the silicon layer SL.

After that, as shown in FIG. 12, an insulating film IF1 is formed so as to cover the patterned silicon layer SL. For example, the insulating film IF can be made up of a silicon oxide film and can be formed by chemical vapor deposition (CVD).

Subsequently, as shown in FIG. 12, an opening penetrating the insulating film IF1 is formed on the insulating film IF1 by photolithography and etching. This partially exposes the surface of the p-type semiconductor region PR from the bottom of the opening. After that, as shown in FIG. 12, the intrinsic germanium layer GL is formed by selective epitaxial growth on the surface of the p-type semiconductor region PR exposed from the bottom of the opening. In the same chamber, the silicon film SF1 is then formed on the intrinsic germanium layer GL by selective epitaxial growth. The semiconductor device is transported from the chamber after this step. At this point, the surface of the intrinsic germanium layer GL is covered with the silicon film SF1 in the third modification and thus the intrinsic germanium layer GL is not exposed. Hence, also in the step of transportation after the formation of the intrinsic germanium layer GL, Ge contamination to a semiconductor manufacturing apparatus can be effectively prevented.

Figure 13:
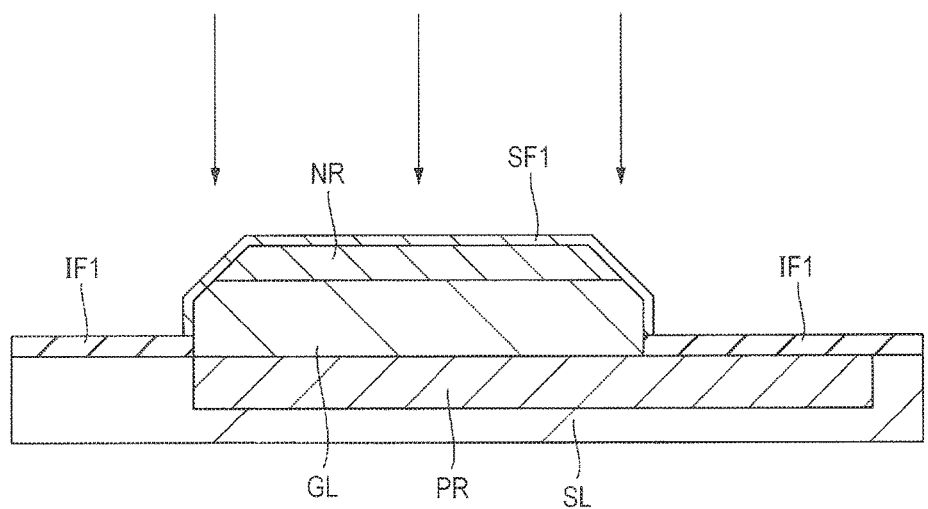
FIG. 13 is a cross-sectional view showing the manufacturing process of the semiconductor device after FIG. 12.

After that, as shown in FIG. 13, the surface of the intrinsic germanium layer GL is doped with an n-type impurity, e.g., phosphorus (P) by photolithography and ion implantation so as to form the n-type germanium layer NR. At this point, the silicon film SF1 covering the intrinsic germanium layer GL is also doped with an n-type impurity, so that the silicon film SF1 is an n-type silicon film. Also in the step of ion implantation, the surface of the intrinsic germanium layer GL is covered with the silicon film SF1 and thus the intrinsic germanium layer GL is not exposed. Hence, also in the step of ion implantation after the formation of the intrinsic germanium layer GL, Ge contamination to the semiconductor manufacturing apparatus can be effectively prevented.

Figure 14:
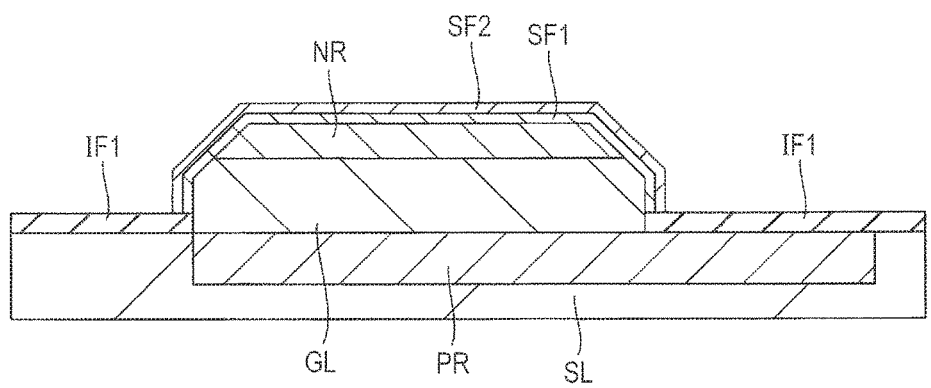
FIG. 14 is a cross-sectional view showing the manufacturing process of the semiconductor device after FIG. 13.
Figure 15:
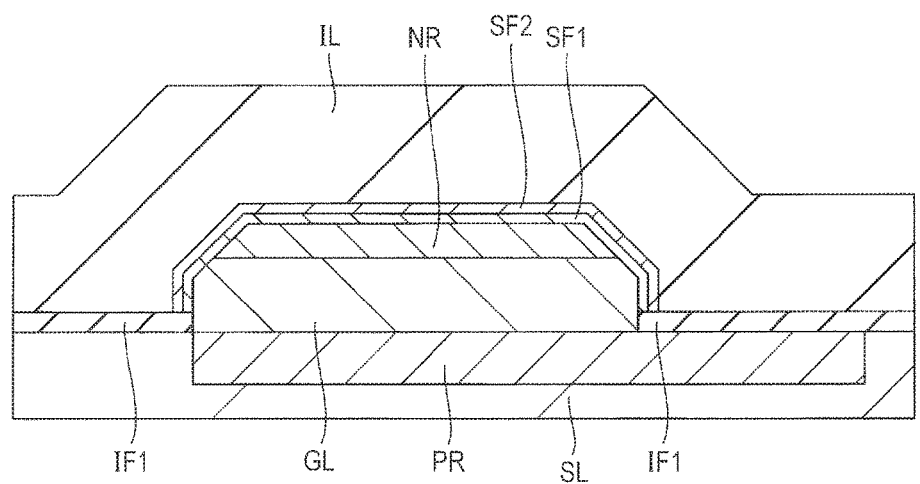
FIG. 15 is a cross-sectional view showing the manufacturing process of the semiconductor device after FIG. 14.

Subsequently, as shown in FIG. 14, the intrinsic silicon film SF2 is formed on the silicon film SF1 by, for example, selective epitaxial growth. After that, as shown in FIG. 15, an interlayer insulating film IL including, for example, a silicon oxide film is formed so as to cover the intrinsic silicon film SF2. Also in the step of forming the interlayer insulating film, the surface of the intrinsic germanium layer GL is covered with the silicon film SF1 and the intrinsic silicon film SF2, thereby preventing the exposure of the intrinsic germanium layer GL. Thus, also in the step of forming the interlayer insulating film after the formation of the intrinsic germanium layer GL, Ge contamination to the semiconductor manufacturing apparatus can be effectively prevented.

Figure 16:
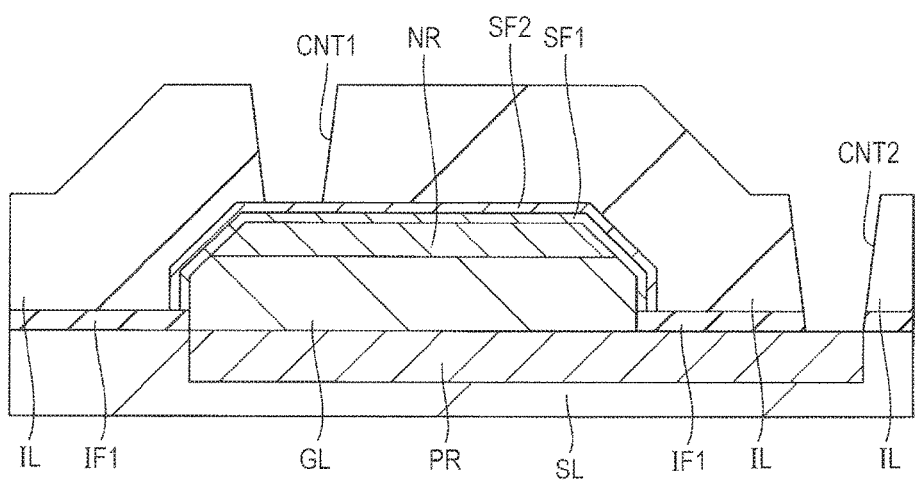
FIG. 16 is a cross-sectional view showing the manufacturing process of the semiconductor device after FIG. 15.

Subsequently, as shown in FIG. 16, a contact hole CNT1 and a contact hole CNT2 are formed on the interlayer insulating film IL by photolithography and etching. Also in the third modification, the intrinsic silicon film SF2 can act as an etching stopper in the formation of the contact hole CNT1 on the interlayer insulating film IL. Specifically, the intrinsic silicon film SF2 includes a film with an etching selection ratio to the silicon oxide film constituting the interlayer insulating film IL, and thus the bottom of the contact hole CNT1 automatically stops at the surface of the intrinsic silicon film SF2 when the silicon oxide film is etched to form the contact hole CNT1. In other words, also in the third modification, the formation of the contact hole CNT1 can be automatically stopped without controlling an etching time before reaching the n-type germanium layer NR. Thus, also in the third modification, the n-type germanium layer NR of the Ge photodiode PD1 and the plug PLG1 are not in direct contact with each other, thereby advantageously obtaining a capacitive coupling structure of the n-type germanium layer NR and the plug PLG1 with ease and reliability.

At this point, also in the third modification, the formation of the contact hole CNT1 is stopped as shown in FIG. 16 before reaching the n-type germanium layer NR. This means that the n-type germanium layer NR is not exposed from the bottom of the contact hole CNT1 also in the step of forming the contact holes according to the third modification. Thus, the third modification does not expose the n-type germanium layer NR and thus can suppress exposure of the n-type germanium layer NR to the atmosphere of etching. This can effectively prevent Ge contamination to the semiconductor manufacturing apparatus in the step of forming the contact holes.

The subsequent steps are similar to those of the embodiment and thus the explanation thereof is omitted. As described above, the semiconductor device including the Ge photodiode PD1 can be manufactured according to the third modification. According to the third modification, even if the n-type germanium layer NR is formed by ion implantation, the exposure of Ge can be prevented in the step of transportation after the formation of the intrinsic germanium layer GL, the subsequent step of ion implantation, and the step of forming the interlayer insulating film as well as in the step of forming the contact holes. Hence, also in the third modification, Ge contamination to the semiconductor manufacturing apparatus can be quite effectively suppressed over the multiple steps.

The invention made by the present inventors was specifically described above according to the embodiment. It is obvious that the present invention is not limited to the embodiment and can be changed in various ways within the scope of the invention.

What is claimed is:

1. A semiconductor device, comprising:
a silicon layer;
a semiconductor region formed in the silicon layer;
a light receiving element comprising a germanium layer formed on the semiconductor region, and
a plug capacitively coupled to the germanium layer.

2. The semiconductor device according to claim 1, further comprising an insulating film interposed between the germanium layer and the plug.

3. The semiconductor device according to claim 2, further comprising:
a silicon oxide film formed on the silicon layer, wherein the insulating film has a higher dielectric constant than the silicon oxide film.

4. The semiconductor device according to claim 2,
wherein the insulating film is a silicon nitride film or a silicon oxynitride film.

5. The semiconductor device according to claim 1, further comprising an intrinsic silicon film interposed between the germanium layer and the plug.

6. The semiconductor device according to claim 1, further comprising, between the germanium layer and the plug, a silicon film that is in contact with the germanium layer and is doped with a conductive impurity, and
an intrinsic silicon film in contact with the silicon film.

7. The semiconductor device according to claim 1,
wherein the germanium layer and the plug are not in direct contact with each other.

8. The semiconductor device according to claim 1,
wherein the light receiving element has a photoelectric conversion function of converting an optical signal and an electric signal.

9. The semiconductor device according to claim 8,
wherein the plug is configured to be a transmission line of the electric signal generated by photoelectric conversion on the optical signal inputted to the germanium layer.

10. The semiconductor device according to claim 1,
wherein the light receiving element is a photodiode.

11. The semiconductor device according to claim 1,
wherein the light receiving element is coupled to a silicon waveguide.

12. A semiconductor device comprising:
a light receiving element including a germanium layer;
a plug separated from the germanium layer, and
an insulating film interposed between the germanium layer and entire bottom portion of the plug facing the germanium layer, preventing the plug from directly contacting the germanium layer.

13. The semiconductor device according to claim 12, wherein only the insulating film is interposed between the germanium layer and the entire bottom portion of the plug facing the germanium layer.

14. A semiconductor device comprising:
a light receiving element including a germanium layer;
a silicon film formed over the germanium layer;
a plug separated from the germanium layer; and
an intrinsic silicon film formed over the silicon film and interposed between the germanium layer and the plug.

15. The semiconductor device according to claim 14, wherein the silicon film is in direct contact with the germanium layer and is doped with a conductive impurity, and
wherein the intrinsic silicon film is in direct contact with the silicon film.

16. The semiconductor device according to claim 15,
wherein the silicon film is an n-type silicon film doped with an n-type impurity.

17. The semiconductor device according to claim 14, wherein the silicon film and the intrinsic silicon film are separate films.

18. The semiconductor device according to claim 14, wherein the silicon film is formed directly over the germanium layer, and
wherein the intrinsic silicon film is formed directly over the silicon film.

* * * * *